United States Patent
Warning, Jr.

(10) Patent No.: US 11,258,229 B2
(45) Date of Patent: Feb. 22, 2022

(54) THERMAL GEL APPLICATION ON ELECTRONIC AND OPTICAL COMPONENTS

(71) Applicant: Cisco Technology, Inc., San Jose, CA (US)

(72) Inventor: Frederick W. Warning, Jr., Mertztown, PA (US)

(73) Assignee: Cisco Technology, Inc., San Jose, CA (US)

(*) Notice: Subject to any disclaimer, the term of this patent is extended or adjusted under 35 U.S.C. 154(b) by 104 days.

(21) Appl. No.: 16/543,341

(22) Filed: Aug. 16, 2019

(65) Prior Publication Data

US 2021/0050707 A1 Feb. 18, 2021

(51) Int. Cl.
| | | |
|---|---|---|
| H01S 5/024 | (2006.01) |
| H01S 5/40 | (2006.01) |
| H01S 5/02325 | (2021.01) |
| H01S 5/02355 | (2021.01) |
| H01S 5/02218 | (2021.01) |
| H01S 5/02253 | (2021.01) |

(52) U.S. Cl.
CPC ...... *H01S 5/02469* (2013.01); *H01S 5/02218* (2021.01); *H01S 5/02325* (2021.01); *H01S 5/02355* (2021.01); *H01S 5/4025* (2013.01); *H01S 5/02253* (2021.01)

(58) Field of Classification Search
CPC ... H01S 5/2235; H01S 5/02218–02235; H01L 23/22–26; H01L 23/42–23/445; H01L 33/641; H01L 33/644
See application file for complete search history.

(56) References Cited

U.S. PATENT DOCUMENTS

| | | | | |
|---|---|---|---|---|
| 5,414,293 A * | 5/1995 | Broom | ............... | H01S 5/02326 257/433 |
| 5,516,727 A * | 5/1996 | Broom | ................ | G02B 6/4202 438/26 |
| 5,907,474 A * | 5/1999 | Dolbear | ................ | H01L 23/04 361/705 |
| 5,939,773 A * | 8/1999 | Jiang | .................... | H01S 5/0231 257/666 |
| 6,111,314 A * | 8/2000 | Edwards | ............... | H01L 23/367 257/704 |
| 6,117,705 A | 9/2000 | Glenn et al. | | |
| 6,275,381 B1 * | 8/2001 | Edwards | ............ | H05K 7/20454 165/185 |
| 6,281,573 B1 * | 8/2001 | Atwood | ............. | H01L 23/3675 165/80.3 |
| 6,396,701 B1 * | 5/2002 | Nakamura | .............. | H01L 23/42 174/252 |

(Continued)

FOREIGN PATENT DOCUMENTS

| | | | | |
|---|---|---|---|---|
| CN | 100386867 C * | 5/2008 | .......... | G02B 6/3692 |
| EP | 2772997 A1 * | 9/2014 | ......... | H01S 5/02476 |

*Primary Examiner* — Joshua King
(74) *Attorney, Agent, or Firm* — Patterson + Sherdan, LLP

(57) ABSTRACT

An optoelectronic assembly and methods of fabrication thereof are provided. The assembly includes a sub-mount, one or more micro-devices attached to the sub-mount, and a lid attached to the sub-mount. The lid includes a dispense channel and a gel groove which allows for a thermal gel to be dispensed between the lid and the micro-device in a manner that mitigates the thermal gel dispersing and/or flowing onto components of the micro-devices.

12 Claims, 10 Drawing Sheets

(56) References Cited

U.S. PATENT DOCUMENTS

| | | | | |
|---|---|---|---|---|
| 6,538,308 B1* | 3/2003 | Nakase | ................... | H01L 23/42 |
| | | | | 257/675 |
| 6,617,682 B1* | 9/2003 | Ma | ................... | H01L 23/36 |
| | | | | 174/253 |
| 6,841,867 B2* | 1/2005 | Matayabas, Jr. | .... | H01L 23/3737 |
| | | | | 257/706 |
| 8,243,454 B2 | 8/2012 | Oota | | |
| 9,022,644 B1* | 5/2015 | Arft | ................... | G01K 13/02 |
| | | | | 374/116 |
| 10,643,924 B1* | 5/2020 | Shen | ................... | H01L 23/3675 |
| 10,644,479 B1* | 5/2020 | Alapati | ................ | H01S 5/02345 |
| 2003/0173051 A1* | 9/2003 | Rinella | ................ | B22D 17/007 |
| | | | | 164/113 |
| 2003/0183909 A1* | 10/2003 | Chiu | .................. | H01L 23/42 |
| | | | | 257/667 |
| 2003/0203188 A1* | 10/2003 | H. | ................... | H01L 24/29 |
| | | | | 428/328 |
| 2004/0262766 A1* | 12/2004 | Houle | .................... | H01L 23/04 |
| | | | | 257/758 |
| 2006/0118925 A1* | 6/2006 | Macris | ................. | H01L 23/433 |
| | | | | 257/667 |
| 2006/0238984 A1* | 10/2006 | Belady | ................. | H01L 23/367 |
| | | | | 361/704 |
| 2009/0166665 A1* | 7/2009 | Haitko | ............. | H01L 27/14618 |
| | | | | 257/100 |
| 2009/0296354 A1* | 12/2009 | Tomioka | ................ | H01L 24/32 |
| | | | | 361/719 |
| 2010/0299918 A1* | 12/2010 | Oda | ..................... | H01L 24/29 |
| | | | | 29/841 |
| 2014/0048924 A1* | 2/2014 | Lee | .................... | H01L 23/3672 |
| | | | | 257/713 |
| 2014/0254100 A1* | 9/2014 | Martin | .............. | H05K 7/20472 |
| | | | | 361/709 |
| 2015/0364455 A1* | 12/2015 | Crobu | .................... | H01L 24/49 |
| | | | | 257/417 |
| 2016/0246019 A1* | 8/2016 | Ishii | ..................... | G02B 6/4249 |
| 2017/0287807 A1* | 10/2017 | Fain | ..................... | H01L 23/055 |

* cited by examiner

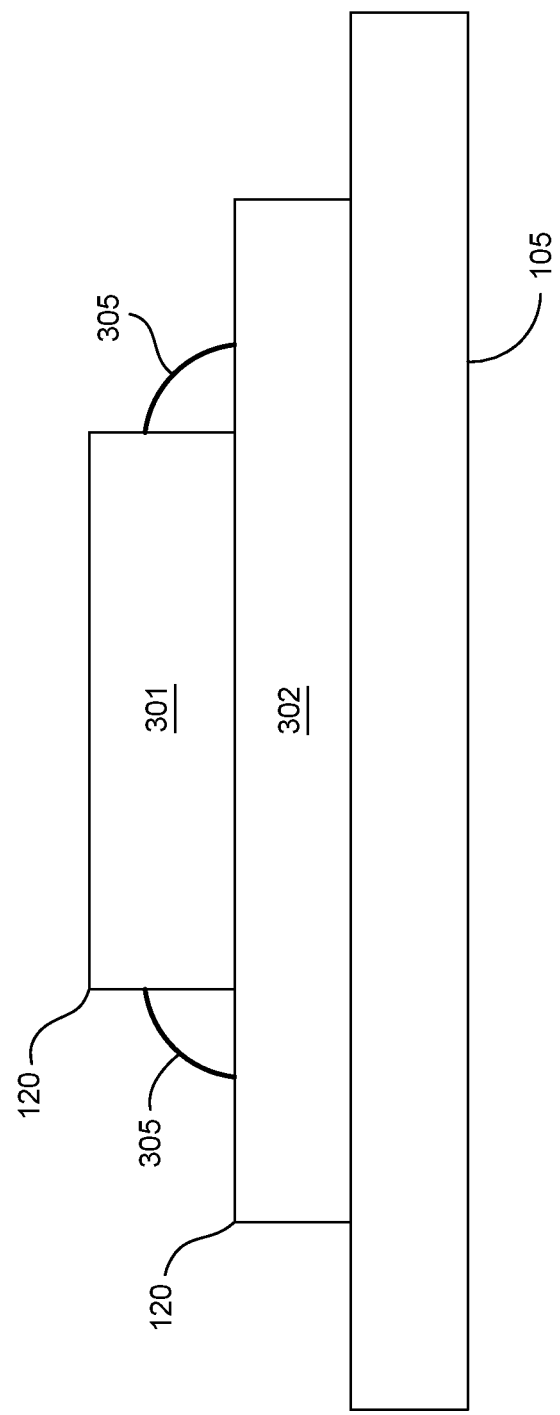

THERMAL GEL APPLICATION ON ELECTRONIC AND OPTICAL COMPONENTS

TECHNICAL FIELD

Embodiments presented in this disclosure generally relate to thermal gel application on micro-electronic and optical devices. More specifically, embodiments described herein provide for controlling the application of thermal gel on small micro-devices using a lid with a dispense channel and a gel groove.

BACKGROUND

Micro-electronic and micro-optical devices generate large amounts of heat during operation which is dispersed via various heat dispersion components. Compliant thermal gels and greases have been developed in order to aid the heat transfer from the micro-devices to a heat dispersion component such as a lid.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-C illustrate various views of the fabrication of an optoelectronic assembly, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
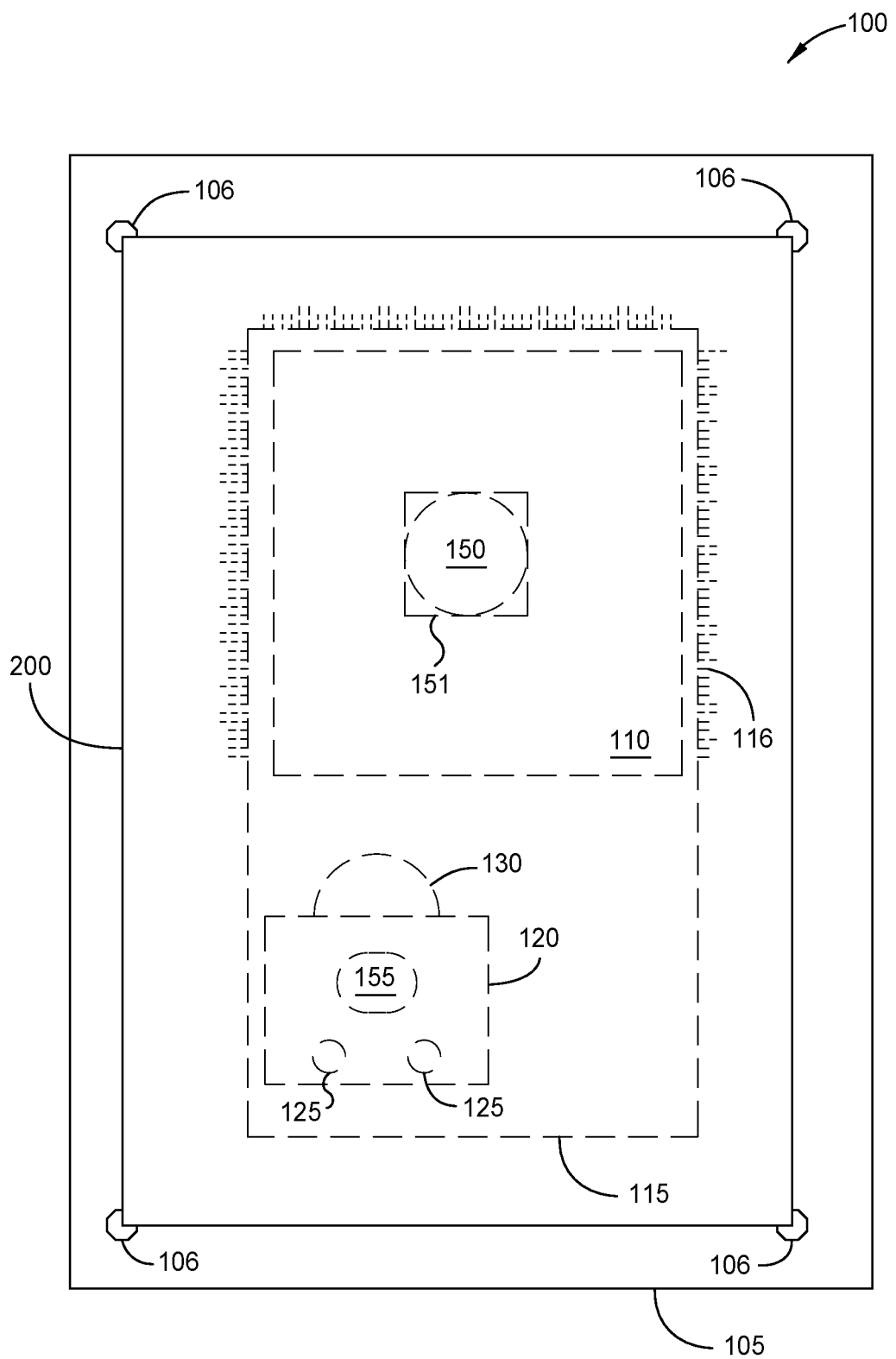
FIG. 1 illustrates a top view of an example optoelectronic assembly without a lid, according to embodiments described herein.

One general aspect includes an optoelectronic assembly. The optoelectronic assembly includes: a first micro-device affixed to a sub-mount, where the first micro-device includes components, and a lid affixed to the sub-mount. The lid includes a dispense channel coupling a top surface of the lid with a bottom surface of the lid, wherein the dispense channel is fluidly connected to a gel groove formed on the bottom surface of the lid, and wherein the lid is disposed over the first micro-device such that a constriction gap is formed between the gel groove and the first micro-device. The optoelectronic assembly also includes a thermal gel disposed between the lid and the first micro-device and within the gel groove, where the thermal gel includes a plurality of filler materials preventing a dispersion of the thermal gel to the components.

One example embodiment an apparatus, including: a lid including a sidewall and a roof disposed thereon and defining a cavity; where a bottom surface of the roof is defined by a first surface and a second surface disposed about the first surface, and where the first surface is recessed relative to the second surface to define a gel groove; and where the lid defines a dispense channel disposed through the roof to fluidly couple a top surface of the roof with the gel groove; and a first micro-device disposed in the cavity in a space-apart relationship with the bottom surface of the lid to form a constriction gap between the second surface of the lid and an upper surface of the first micro-device that has a minimum distance less than a minimum distance between the first surface of the lid and the upper surface of the first micro-device.

One example embodiment includes a method for manufacturing an optical assembly. The method includes: affixing a first micro-device to a sub-mount for the optical assembly, where the first micro-device includes components and affixing a lid to the sub-mount such that the lid is disposed over the first micro-device such that a constriction gap is formed between the lid and the first micro-device. The lid further includes a dispense channel through a top surface of the lid, where the dispense channel is connected to a gel groove on a bottom surface of the lid, where the gel groove includes a gel groove edge on the bottom surface of the lid, and where the constriction gap is formed between the gel groove edge and the first micro-device. The method also includes dispensing a thermal gel in the dispense channel of the lid where the thermal gel flows through the dispense channel to fill the gel groove, where a plurality of filler material within the thermal gel prevents a dispersion of the thermal gel to the components

Example Embodiments

Micro-electronic and micro-optical devices generate large amounts of heat during operation. For example, both integrated circuits (IC) and lasers can generate heat that can damage the devices if the heat is not handled properly. In many cases, these heat-generating micro-devices can be joined with heat exchangers which can disperse the heat. However, optical devices with sensitive optical alignments cannot be physically bound to multiple material sets (e.g., heat exchangers) with different thermal expansions because the temperature caused stress changes on the materials during operation of the micro-devices can cause optical misalignments. Compliant thermal gels and greases have been developed in order to aid the heat transfer from the micro-devices to the heat exchangers. These thermal gels do not cause optical misalignment or other stress based issues since the gels conform to small relative motions without causing additional stress.

Control of the location of thermal gels is difficult during application. The materials of the thermal gels are usually viscous and difficult to dispense in controlled volumes and shapes. For relatively larger micro-devices, the thermal gel can be controlled to an extent which prevents a flow or dispersion of the thermal gel onto sensitive components of the micro-device. However, with the decreasing size of micro-devices, the area where a thermal gel can be applied without interacting with sensitive components of the micro-devices is also decreasing.

The assemblies and methods described herein provide for the application of a thermal gel on micro-devices while preventing the thermal gel from dispersing onto sensitive components of the micro-device. The opto-electronic assemblies described herein include a lid disposed over a micro-device, where the lid includes a dispersion channel where the thermal gel can be applied to the micro-device through the lid. The lid is also disposed over the micro-device such that a constriction gap is formed between the lid and the micro-device, where the thermal gel does not flow through the constriction gap. Thus the location of the thermal gel can be controlled using the lid affixed over the micro-device.

FIG. 1 illustrates a top view of an example optoelectronic assembly, assembly 100, without a lid, according to embodiments described herein. The assembly 100 includes a sub-mount 105 and a component base 115. In some examples, the component base 115 is a part of the sub-mount 105. In some examples, the sub-mount and/or the component base may include a substrate, a printed circuit board (PCB), a ceramic material, an IC, and/or other material to which optical and/or electronic components described herein may be mounted.

The assembly 100 also includes one or more heat generating micro-devices, such as micro-devices 110 and 120. In some examples, the micro-device 110 is an electronic micro-device such as a semiconductor-chip, IC, etc. The micro-device 110 includes sensitive components such as wire leads 116 connected to and/or associated with the micro-device 110. The micro-device 120 may include a micro-optical device such as a laser, a PIN diode, etc. The micro-device 120 also includes sensitive components such as vias 125 and lens 130 among others not shown in FIG. 1 (e.g., wire-bonds, etc.). In some examples, the sensitive components (including wire leads, vias, lens, etc.) are any electrical, optical, or other component and/or element associated with a micro-device whose function and/or structure may be altered if contacted by a thermal gel and/or other environmental actors. For example, the electrical connection of wire leads 116 may be compromised if contacted by the thermal gel. Further, the optical function of the lens 130 may also be damaged when contacted by a thermal gel. In order to protect the sensitive components of the micro-devices 110 and 120 from damage and/or exposure to environmental elements, a lid is provided, such as the lids described in relation to FIGS. 2A-B and 4A-D.

In some examples, the lids described herein are affixed to the sub-mount 105 along mounts 106. The mounts 106 may include specific points on the sub-mount 105 to attach the lid. The mounts 106 may also include a mounting seam or location on the sub-mount 105 along which a lid is mounted/attached. In some examples, the lids also serve as a heat exchanger to disperse heat from the heat generating micro-devices, micro-devices 110 and 120, in the assembly 100. In order to conduct heat away from the micro-devices to a lid, a thermal gel is disposed between the micro-devices and the lid. In some examples, a micro-device is large enough and/or has a surface large enough for the thermal gel to be applied onto the micro-device prior to a lid being affixed to the sub-mount 105. For example, the thermal gel 150 is disposed on the micro-device 110 prior to the lid being positioned over the micro-devices and sub-mount 105.

During application of the thermal gel prior to attaching a lid, the thermal gel 150 disperses on the micro-device 110 to a gel perimeter 151 representing the outer boundary of the gel dispersal area. In some examples, the smallest extent of the gel perimeter 151 is approximately 2.5 millimeters (mm) radially from a center of an application point of the gel, such as the center of the micro-device 110. This dispersal is due to various properties of the thermal gel and while the dispersal may be controlled by application methods and gel properties, the dispersal of the gel cannot be restricted to less than 2.5 mm without a lid described herein. In this example, the thermal gel 150 is not near the sensitive components of the micro-device 110, such that the gel perimeter 151 does not endanger the sensitive components.

The micro-device 120 is smaller than the micro-device 110 and a thermal gel applied to the micro-device 120 should stay within a gel application area 155 that is smaller in width/diameter than the gel perimeter 151 in order to not endanger the sensitive components of the micro-device 120 (e.g., the vias 125 and the lens 130, among others). In this example, the gel application area 155 is approximately 0.5 mm or less. Application of a thermal gel using previous standard methods would result in a dispersal of the gel onto the sensitive components of the micro-device 120. The lid and methods described herein provide a method to restrict an application of the thermal gel to the gel application area 155 (i.e., restrict a dispersal of the thermal gel to 0.5 mm or less). In some examples, the gel application area 155 is located in the center of a top surface the micro-device 120. In other examples, the gel application area 155 may located at one or more offset locations (e.g., not the center of the micro-device 120) according to a placement of the sensitive components of the micro-device. For example, the gel application area 155 may be positioned at an offset location to avoid overlapping with the vias 125 and/or other sensitive components.

Figure 2A:
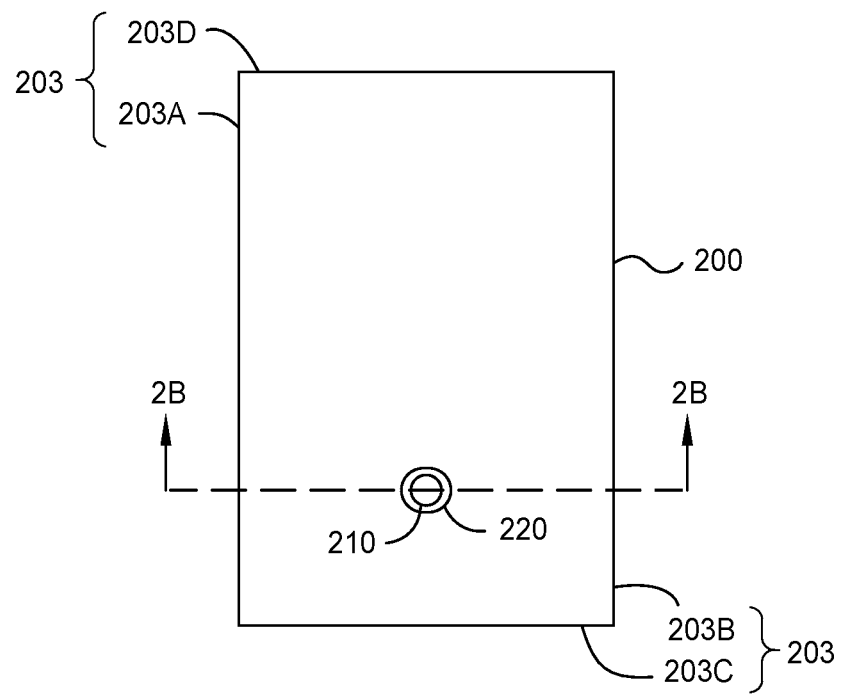
FIG. 2A illustrates a semi-transparent top view of a lid for an optoelectronic assembly, according to embodiments described herein.
Figure 2B:
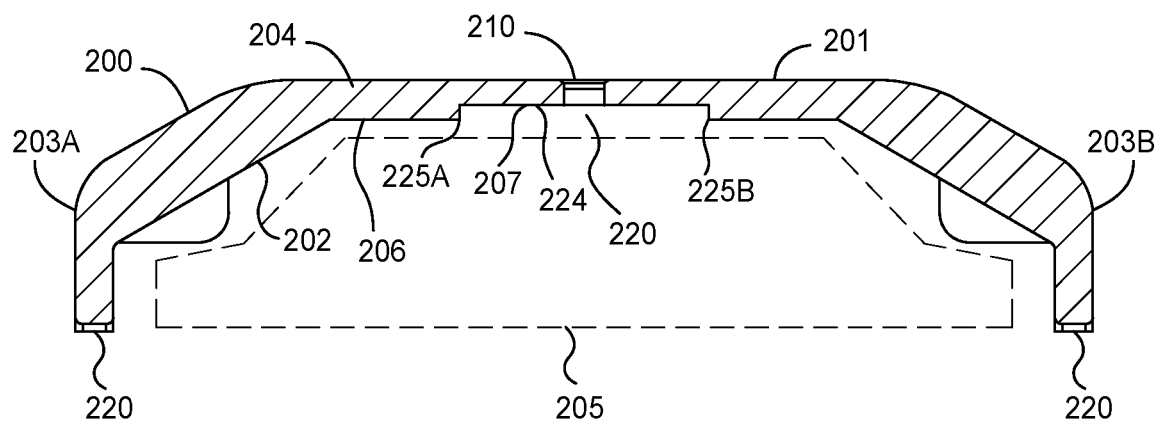
FIG. 2B illustrates a cross-sectional view of a lid for an optoelectronic assembly, according to embodiments described herein.

FIG. 2A illustrates a semi-transparent top view of a lid for an optoelectronic assembly and FIG. 2B illustrates a cross-sectional view of a lid for an optoelectronic assembly along the section line A-A shown in FIG. 2A, according to embodiments described herein. The lid 200 is composed of a heat conducting material (e.g., a metallic material, a ceramic material, etc.), where the heat conducting material serves as a heat exchanger and provides thermal dispersion to one or more micro-devices. The lid 200 also includes a structure sufficient to cover and provide protection to the micro-devices under the lid (e.g., micro-devices 110 and 120) and to the sensitive components connected to and/or associated with the micro-devices (e.g., the wire leads 116, vias 125, lens 130, etc.). The structure includes the sidewall portions 203a-d, which together form a sidewall 203.

The lid 200 also includes the dispense channel 210. In some examples, the dispense channel 210 includes a hole, groove, and/or combination of features defined in the lid 200 to guide a dispensed thermal gel through a top surface 201 of the lid 200 to a gel groove 220 on the bottom surface 202 of the lid 200 such that the dispense channel 210 is fluidly connected to the gel groove 220. As illustrated in FIG. 2B, the lid 200 includes a sidewall portion including the sidewall portions 203a and 203b and a roof portion including the roof 204 on the sidewall portions 203a and 203b. The roof 204 and sidewall 203 define a cavity 205 between the roof and the sidewall. The gel groove 220 is formed in the bottom surface 202. The bottom surface 202 includes a first surface 207 and a second surface 206 where the first surface 207 is recessed relative to the second surface. The gel groove is defined by a recessed floor 224. The gel groove is also defined by parallel gel groove edges, gel groove edges 225A-B, on either side of the recessed floor 224. In some examples, the lid 200 includes multiple dispense channels located over a single micro-device and/or multiples dispense channels over a plurality of micro-devices such as described herein in relation to FIG. 4D. The processes describing the joining of the lid 200 and the assembly 100 are described in relation to FIGS. 3A-C and FIG. 6.

Figure 3B:
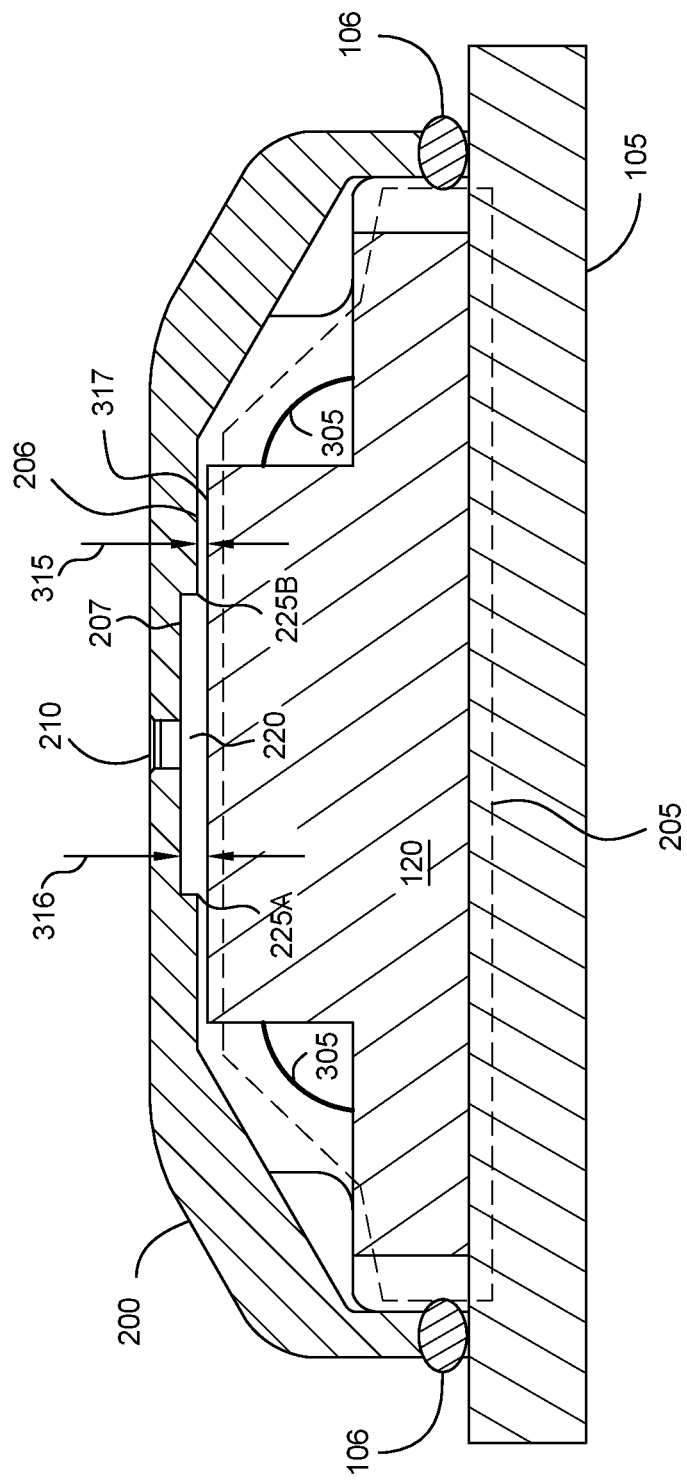
Figure 3C:
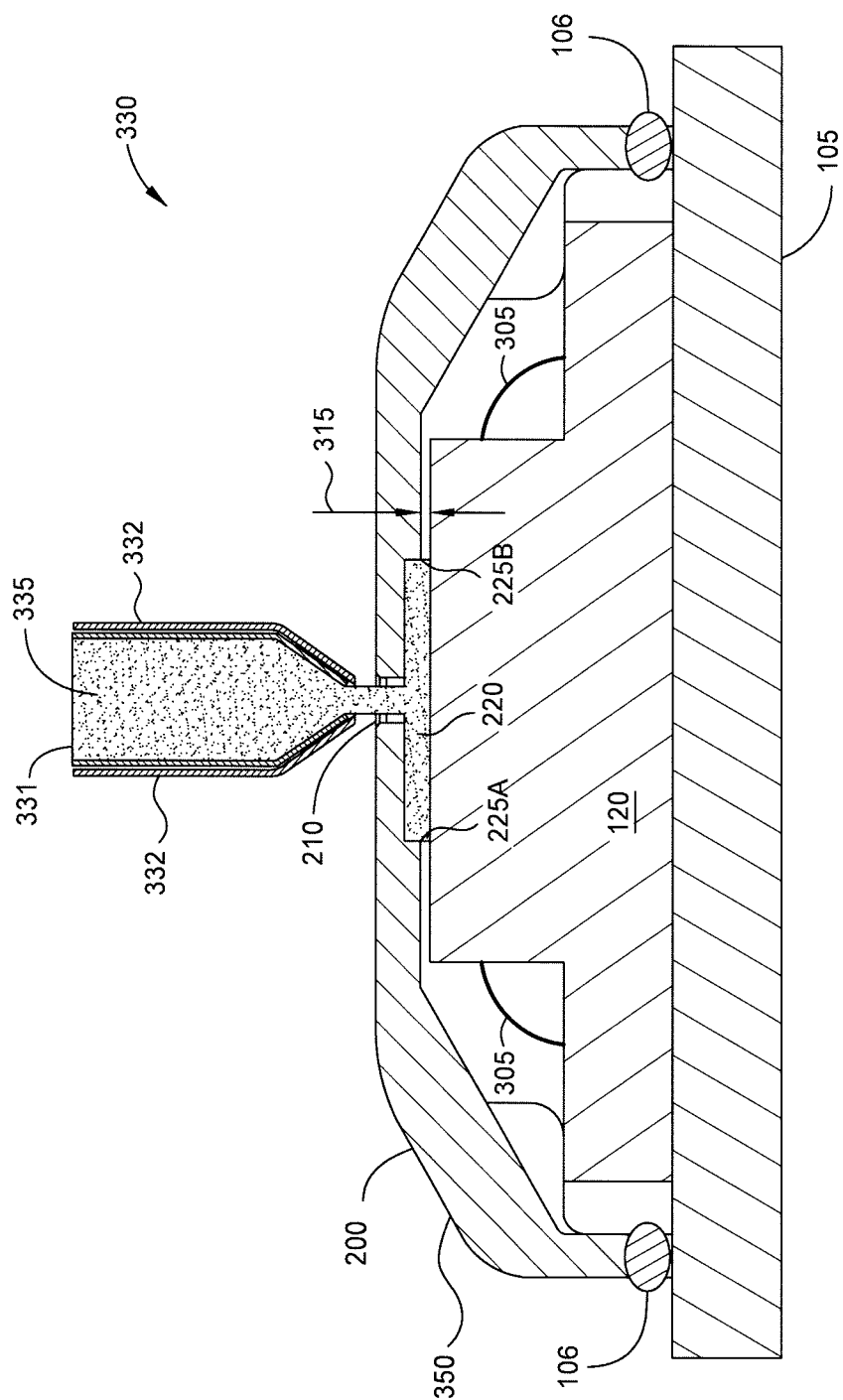

FIGS. 3A-C illustrate various views of the fabrication of an optoelectronic assembly, according to embodiments described herein. FIG. 3A illustrates a side view of a first step in the fabrication of an optoelectronic assembly. At this step in the fabrication, a first heat generating micro-device is affixed to a sub-mount, where the first micro-device includes sensitive components. For example, as shown in FIG. 1, the micro-device 120 is affixed to the sub-mount 105 (and/or the component base 115). In some examples, the micro-device includes various mounts and sub-mounts within the device. For example, micro-device 120 may include a sub-mount 302, e.g., an IC component, mounted on the sub-mount 105 (and/or the component base 115) and a laser 301 on the sub-mount 302. The sub-mount 302 and laser 301 will be referred to as the micro-device 120 herein. In some examples, the micro-device 120 includes sensitive components, including the lens 130 and vias 125 discussed in relation to FIG. 1 as well as the wire leads 305 connected to the micro-device 120 as shown in FIGS. 3A-C. In some examples, the micro-device 120 is further processed according to standard fabrication techniques in order to position/attach/process the additional components and sensitive components of the micro-device 120.

In examples where multiple micro-devices are mounted to the sub-mount 105 (e.g., the micro-device 110 and 120), the additional micro-devices are also affixed to the sub-mount 105 and further processed according to standard fabrication techniques in order to position/attach/process the additional components and sensitive components of the additional micro-devices to the sub-mount 105. In some examples, a thermal gel is applied to the micro-device 110 (and micro-devices on the sub-mount 105). The processed sub-mount 105 and attached micro-devices are then covered by a lid to protect the micro-devices and sensitive components of the assembly.

FIG. 3B illustrates a side view of a second step in the fabrication of an optoelectronic assembly. At this step in the fabrication process, a lid is affixed to the sub-mount. For example, the lid 200 is affixed to the sub-mount 105. In some examples, the lid is affixed to the sub-mount 105 along the mount points, mounts 106 using an epoxy, solder, and/or other attachment technique. In some examples, the lid 200 is positioned over the sub-mount 105 and the micro-devices 110 and 120 such that the sensitive components of each micro-device are covered by the lid 200. For example, in arrangement 400 in FIG. 4A, the lid 200 is positioned over the micro-devices 110 and 120 to protect the wire leads 116 of micro-device 110 and the vias 125 and lens 130 of micro-device 120. The lid 200 is also positioned such that the dispense channel 210 is disposed over the gel application area 155, where a thermal gel may be dispensed into the gel application area 155 once the lid 200 is affixed to the sub-mount 105.

Figure 4A:
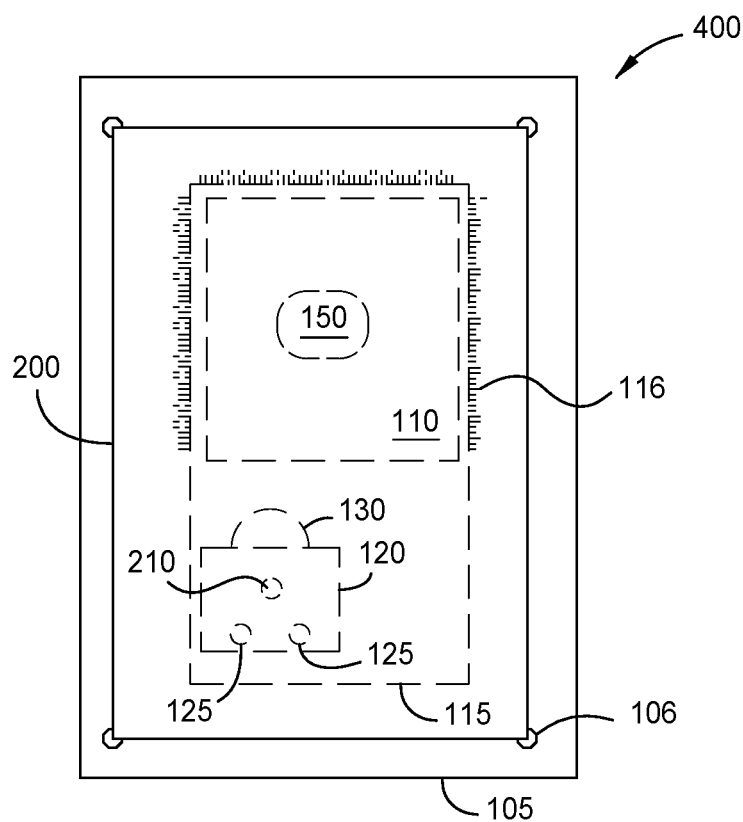
FIGS. 4A-D illustrate various top views of optoelectronic assemblies with lids, according to embodiments described herein.
Figure 4B:
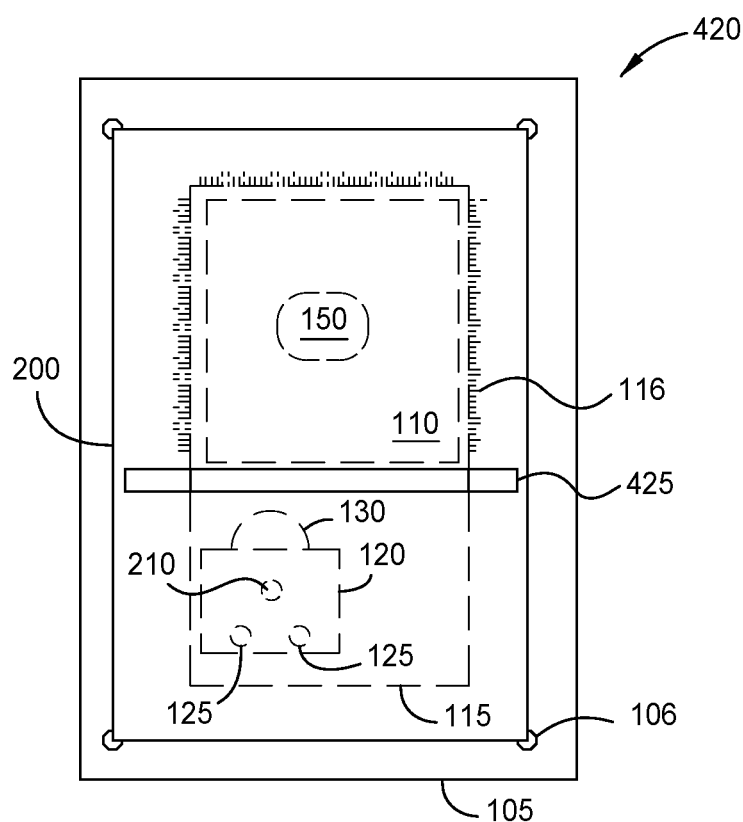
Figure 4C:
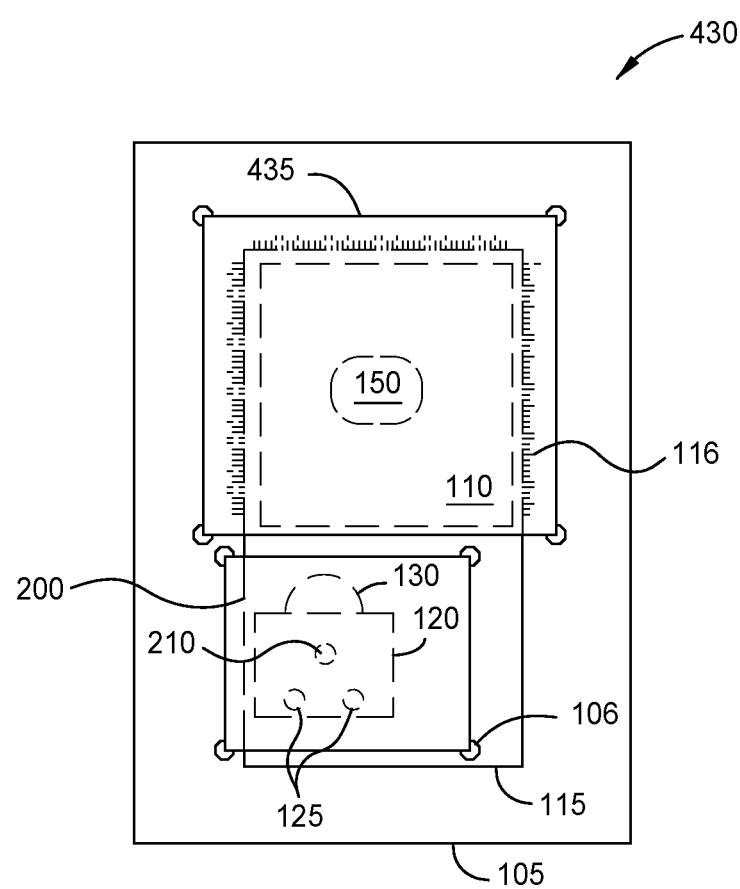

In some examples, such as the arrangement 420 in FIG. 4B, the lid 200 includes a separation section 425 between a first section 424 of the lid 200 and a second section 426 of the lid 200. The first section 424 is disposed over the micro-device 110 and the second section 426 is disposed over the micro-device 120. The separation section may include a gap or void in the lid 200 and/or a non-conductive material. In some examples, the separation section 425 prevents heat transfer from the micro-device 110 to the micro-device 120 via the lid 200 during operation of the micro-devices.

In some examples, the lid 200 is disposed over the micro-device 120 and a separate lid is disposed over one or more other micro-devices on the sub-mount 105. For example, in the arrangement 430 in FIG. 4C, the lid 200 is disposed over the micro-device 120 to protect the vias 125 and lens 130 of micro-device 120. The lid 200 is also positioned such that the dispense channel 210 is disposed over the gel application area 155, where a thermal gel may be dispensed onto the gel application area 155 once the lid 200 is affixed to the sub-mount 105. A second lid 435 is disposed over the micro-device 110 to protect the wire leads 116 and other sensitive components of the micro-device 110. The use of separate lids prevents heat from either of the micro-devices 110 and/or 120 from interacting via the lids.

In some examples, the sub-mount 105 may include multiple smaller micro-devices with an associated dispense hole in a lid over each of the multiple micro-devices. For example, in arrangement 450 shown in FIG. 4D, a lid 455 includes a first dispense channel 461 over the micro-device 120 and a second dispense channel 462 over a micro-device 451. The micro-device includes sensitive components 452 where a thermal gel is restricted to a gel application area 453 to prevent the thermal gel from covering the sensitive components 452. The lid 455 is positioned such that the dispense channel 461 and/or a gel groove 454 on the bottom surface of the lid 455 is disposed over the gel application area 453. Likewise, the dispense channel 461 and/or gel groove 464 is disposed over the gel application area 155.

Returning back to FIG. 3B, the lid 200 (and/or other lids described in relation to FIGS. 4A-D) is positioned/disposed over the micro-device 120 and/or the micro-device 120 is disposed in the cavity 205 in a space-apart relationship with the bottom surface 202 of the lid 200. The space-apart relationship forms the constriction gap 315 between the second surface 206 and an upper surface 317 of the micro-device 120. The constriction gap 315 has a minimum distance less than a minimum distance 316 between the first surface 207 and the upper surface 317 of the micro-device 120. The constriction gap 315 allows for the micro-device 120 and the lid 200 to expand and/or contract due to heat generation during operation of the micro-device 120, without interfering with the other components. The constriction gap 315 also prevents thermal gel in the gel groove 220 from dispersing onto the sensitive components (e.g., the wire leads 305 and the sensitive components described in relation to FIG. 1).

Figure 5A:
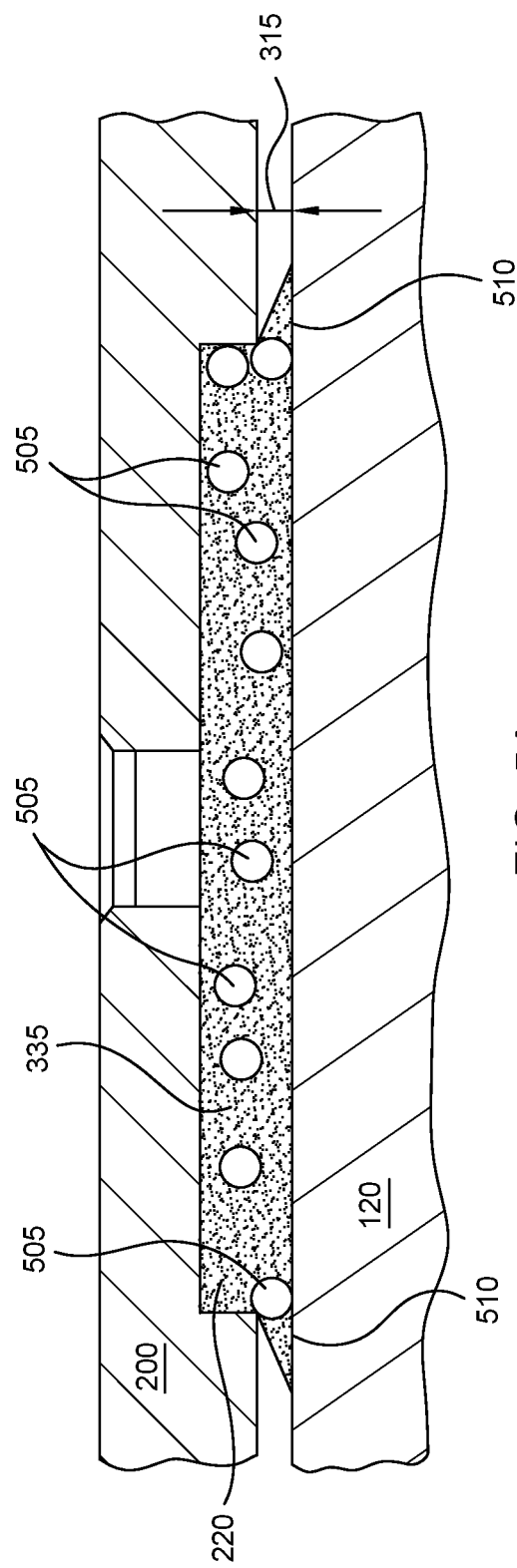
FIG. 5A illustrates a cross-sectional view of a gel groove with a thermal gel in a lid, according to embodiments described herein.

FIG. 3C illustrates a side view of a third step in the fabrication of an optoelectronic assembly. At step 330, a thermal gel 335 is dispensed through the dispense channel 210 into the gel groove 220. In some examples, the thermal gel 335 includes a plurality of filler materials in the thermal gel preventing a dispersion of the thermal gel beyond the constriction gap 315 to the sensitive components. For example, as shown in FIG. 5A, the thermal gel 335 includes micro-beads 505 dispersed in the thermal gel. The micro-beads 505 include beads that flow with the thermal gel through the gel groove 220 to the constriction gap 315, where the beads meet the constriction gap 315 and form a barrier to prevent the thermal-gel from further dispersion. While shown as part of the lid 200 in FIG. 5A, the gel groove 220 may also include a groove component formed by features in and/or deposited on the surface of the micro-device 120 where the groove in the lid 200 and the groove formed by the features on the micro-device 120 together form the gel groove 220. In another example, the gel groove 220 may be formed completely by components deposited on the micro-device 120, where the lid 200 includes a flat portion on the bottom surface of the lid 200 and the gel groove 220 is a groove formed between the deposited components on the micro-device 120.

In some examples, a portion 510 of the thermal gel 335 may disperse beyond the barrier (e.g., before the barrier is formed by the micro-beads), but does not reach any sensitive components of the micro-device 120. In some examples, the gel groove 220 and/or the gel groove edges 225A-B limits the portion 510 from dispersing onto the sensitive components. The gel groove 220 and/or the gel groove edges 225A-B may also steer and/or direct the portion 510 from dispersing onto the sensitive components.

In some examples, the thermal gel 335 is dispensed onto gel application area 155 prior to affixing the lid 200 to the sub-mount 105. In this example, the gel groove 220 and/or the gel groove edges 225A-B prevent the dispensed gel from dispersing onto the sensitive components when the lid is affixed to the sub-mount 105.

Figure 5C:
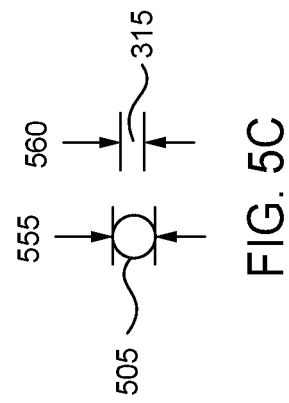
FIG. 5C illustrates detailed views of a gel bead and a constriction gap, according to embodiments described herein.
Figure 5B:
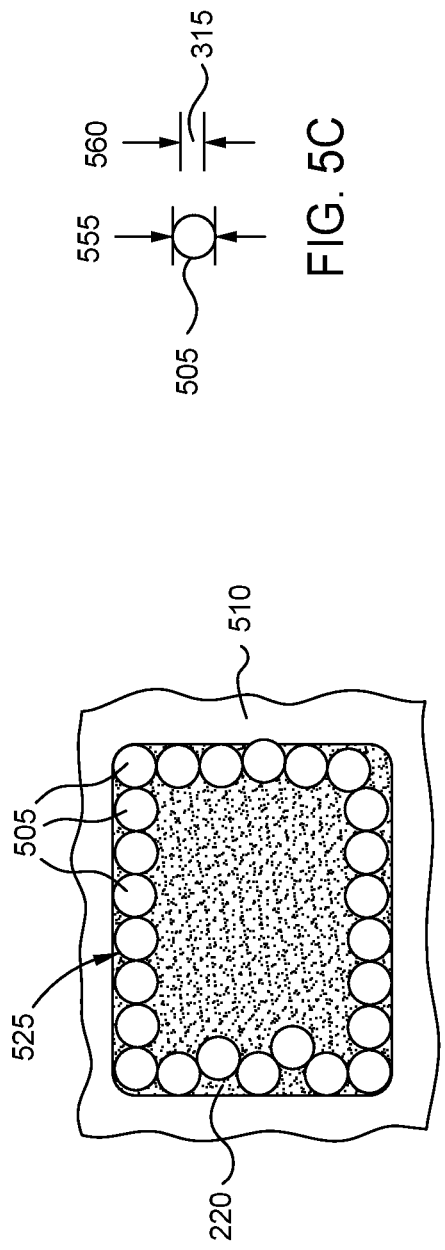
FIG. 5B illustrates a top view of a gel groove with a thermal gel, according to embodiments described herein.

FIG. 5B illustrates a top view of a gel groove with a thermal gel, according to embodiments described herein. A subset of the micro-beads 505 form the barrier 525 to prevent the dispersion of the thermal gel 335 onto the sensitive components of the micro-device. In some examples, the barrier 525 is formed when the micro-beads cannot flow through the constriction gap 315. For example, as shown in FIG. 5C which illustrates detailed views of a gel bead and a constriction gap, the micro-beads 505 have a diameter 555 larger than a measure 560 of the constriction gap 315. While described herein as micro-beads other materials including other materials of varying geometric forms may also be used to prevent the flow of the thermal gel beyond the constriction gap 315 including other filler materials and/or geometric forms larger than the measure 560. In some examples, the thermal gel includes a viscous material with a viscosity which prevents the thermal gel from flowing beyond the constriction gap 315 (e.g., the viscosity of the thermal gel prevents it from flowing through the constriction gap). In this example, the thermal gel may not contain the micro-beads since the constriction gap 315 and viscosity of the thermal gel prevent the flow of the thermal gel onto the sensitive components.

Returning back to FIG. 3C, the thermal gel 335 is dispersed from an application device 331 into the dispense channel 210. In some examples, the application device 331 includes the heating elements 332 which heats the thermal gel 335 to a sufficient temperature to allow easier flow from the application device 331 into the dispense channel 210. The thermal gel 335, once dispersed in the gel groove 220, provides heat dispersion from the micro-device 120 via the lid 200 without causing stress to the micro-device in the optoelectronic assembly 350.

Figure 4D:
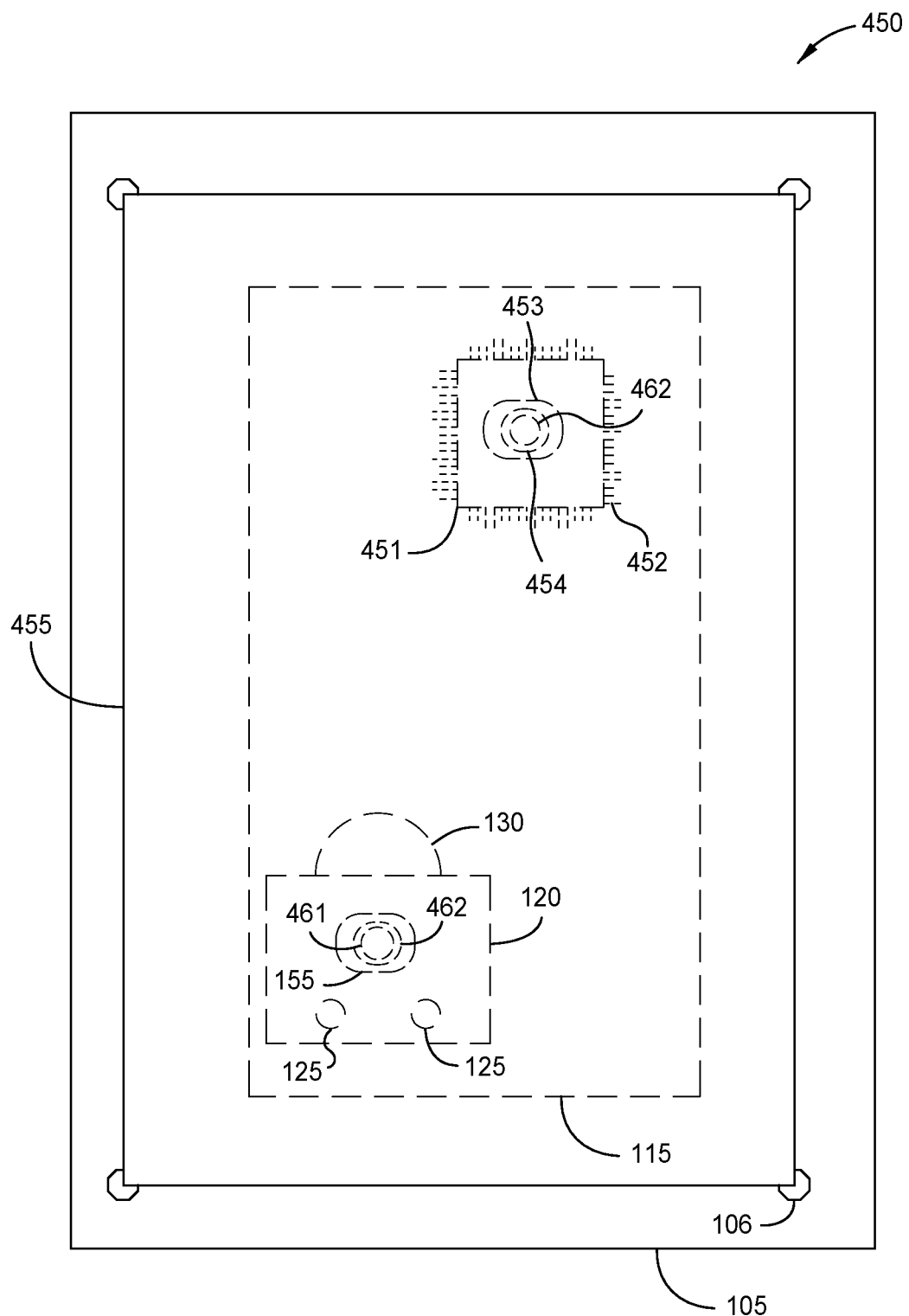
Figure 6:
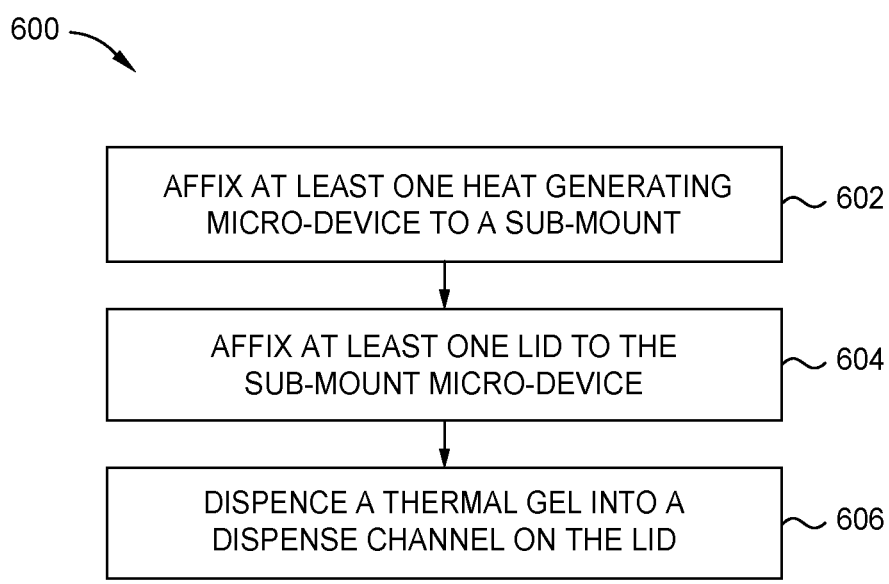
FIG. 6 is a flow chart outlining general operations in an example method to produce an optoelectronic assembly, according to embodiments described herein.

FIG. 6 is a flow chart outlining general operations in an example method to produce an optoelectronic assembly, according to embodiments described herein. Method 600 begins at block 602 where a first heat generating micro-device affixed to a sub-mount. For example the micro-device 120 shown in FIG. 1 including sensitive components (e.g., the vias 125 and the lens 130) is affixed to the sub-mount 105 as described in relation to FIG. 3A. In some examples, a second heat-generating micro device, such as the micro-device 110 described in FIG. 1 and/or the micro-device 451 described in relation to FIG. 4D, is also affixed to the sub-mount 105.

In examples where multiple micro-devices are mounted to the sub-mount 105 (e.g., the micro-device 110 and 462), the additional micro-devices are also affixed to the sub-mount 105 and further processed according to standard fabrication techniques in order to position/attach/process the additional components and sensitive components of the additional micro-devices to the sub-mount 105. In some examples, a thermal gel is applied to the micro-device 110 (and other micro-devices on the sub-mount 105).

At block 604, a lid is affixed to the sub-mount. For example, the lid 200 is affixed to the sub-mount 105 as described in relation to FIG. 3B. In some examples, the lid 200 includes a dispense channel 210 through a top surface 201 of the lid 200, where the dispense channel 210 is connected to a gel groove 220 on a bottom surface 202 of the lid 200. The gel groove 220 includes gel groove edges 225A-B on the bottom surface 202 of the lid 200. In some examples, the lid 200 is disposed over the first micro-device, the micro-device 120, such that a constriction gap 315 (as described in relation to FIGS. 3B, 3C, and 5A-C) is formed between the gel groove edges 225A-B and the micro-device 120.

In some examples, the lid 200 covers a second micro-device such as the micro-device 110. As described above a thermal gel may be applied to a top surface of the micro-device 110 prior to the lid being positioned and affixed to the sub-mount 105. For example, the thermal gel 150 described in FIG. 1 is applied/dispensed to the micro-device 110 prior to the lid 200 being fixed to the sub-mount 105. The thermal gel 150 thus provides heat dispersion from the micro-device 110 via the lid 200.

In some examples, the lid 200 may include a separation section 425, as described in relation to FIG. 4B, where the separation section 425 is between a first section 424 and a second section 426 of the lid 200, in order to prevent heat transfer between the first micro-device and the second micro-device via the lid.

In some examples, the lid 200 covers one or more additional heat generating micro-devices (such as the micro-device 451) affixed to the sub-mount 105. Due to the size of the micro-device 451 and/or gel application area 453 the thermal gel should be dispersed in a manner similar to the manner in which thermal gel was dispersed over micro-device 120. In this example, the lid 200 also includes the dispense channel 462 connected to the gel groove 454 as described in relation to FIG. 4D. While shown in FIG. 4D with one additional micro-device, the sub-mount 105 may include multiple additional micro-devices and the lid 200 may include multiple additional dispense channels and additional gel grooves similar to the dispense channels 210 and 462 and gel groove 220.

At block 606, a thermal gel is dispensed in the dispense channel of the lid. For example, as described in relation to FIG. 3C, the thermal gel 335 is dispensed through the dispense channel 210 and flows through the dispense channel 210 to fill the gel groove 220. In some examples, the thermal gel includes a plurality of filler material within the thermal gel which prevents a dispersion of the thermal gel to the sensitive components. For example, as described in relation to FIGS. 5A-C, the thermal gel includes micro-beads 505 which form a barrier 525 at the gel groove edges 225A-B. The micro-beads have a diameter 555 greater than a measure 560 of the constriction gap 315 which stops the flow of the thermal gel 335 from the gel groove 220 and prevents the dispersion of the thermal gel onto the sensitive components of the micro-device 120.

In an example where the lid 200 includes multiple other dispense channels, the thermal gel is also dispensed in the multiple other dispense channels in a manner similar to that described in relation to block 606. The dispersed thermal gel also includes materials (e.g., the micro-beads) which conduct heat from the micro-device 120 to the lid 200 for heat dispersion via the lid in the optoelectronic assembly 350.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

It should also be noted that, in some other implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

That which is claimed:

1. An optoelectronic assembly, comprising:
a sub-mount;
a first micro-device affixed to the sub-mount, wherein the first micro-device comprises components;
a second micro-device affixed to the sub-mount;
a lid affixed to the sub-mount, wherein the lid comprises a dispense channel coupling a top surface of the lid with a bottom surface of the lid, wherein the dispense channel is fluidly connected to a gel groove formed on the bottom surface of the lid, and wherein a first section of the lid is disposed over the first micro-device forming a constriction gap between the lid and the first micro-device, wherein a second section of the lid is disposed over the second micro-device, wherein the lid further comprises a separation section between the first section and the second section, wherein the separation section comprises a dap in the lid, and wherein the dap prevents heat transfer between the first micro-device and the second micro-device via the lid; and
a thermal gel disposed between the lid and the first micro-device and within the gel groove, wherein the thermal gel comprises a plurality of filler material preventing dispersion of the thermal gel to the components.

2. The optoelectronic assembly of claim 1, wherein the plurality of filler material comprises a plurality of micro-beads, wherein the micro-beads comprise a diameter larger than a measure of the constriction gap between the gel groove and the first micro-device.

3. The optoelectronic assembly of claim 2, wherein a subset of the plurality of micro-beads is disposed in the thermal gel and forms a barrier at the constriction gap to prevent the dispersion of the thermal gel onto the components.

4. The optoelectronic assembly of claim 1, wherein the thermal gel conducts heat from the first micro-device to the lid for heat dispersion via the lid.

5. The optoelectronic assembly of claim 1, wherein
the second micro-device is affixed to the sub-mount; and
wherein the optoelectronic assembly further comprises
a second thermal gel disposed between the second micro-device and the lid, wherein the second thermal gel conducts heat from the second micro-device to the lid for heat dispersion via the lid.

6. The optoelectronic assembly of claim 1, wherein the optoelectronic assembly further comprises:
one or more additional micro-devices affixed to the sub-mount, wherein the one or more additional micro-devices comprise components;
wherein the lid further comprises one or more additional dispense channels through the top surface of the lid, wherein the one or more additional dispense channels are connected to one or more additional gel grooves on the bottom surface of the lid, and wherein the lid is disposed over the first micro-device and the one or more additional micro-devices forming constriction gaps between the lid and the one or more additional micro-devices; and
a thermal gel disposed between the lid and the one or more additional micro-devices and within the one or more additional gel grooves.

7. An apparatus, comprising:
a lid comprising a sidewall and a roof disposed thereon and defining a cavity; wherein a bottom surface of the roof is defined by a first surface and a second surface disposed about the first surface, and wherein the first surface is recessed relative to the second surface to define a gel groove; and wherein the lid defines a dispense channel disposed through the roof to fluidly couple a top surface of the roof with the gel groove;
a first micro-device disposed in the cavity in a space-apart relationship with the bottom surface of the lid to form a constriction gap between the second surface of the lid and an upper surface of the first micro-device that has a minimum distance less than a minimum distance between the first surface of the lid and the upper surface of the first micro-device; and
a second micro-device disposed in a space-apart relationship with a second section of the bottom surface of the lid apart from the cavity, wherein the lid further comprises a separation section between a first section of the lid and a second section of the lid, wherein the separation section comprises a cap in the lid, and wherein the gap prevents heat transfer between the first micro-device and the second micro-device via the lid.

8. The apparatus of claim 7, further comprising:
a thermal gel disposed between the lid and the first micro-device and within the gel groove, wherein the thermal gel comprises a plurality of filler material preventing dispersion of the thermal gel to components of the first micro-device.

9. The apparatus of claim 8, wherein the plurality of filler material comprises a plurality of micro-beads, wherein the micro-beads comprise a diameter larger than a measure of the constriction gap the second surface of the lid and an upper surface of the first micro-device.

10. The apparatus of claim 8, wherein the thermal gel conducts heat from the first micro-device to the lid for heat dispersion via the lid.

11. The apparatus of claim 9, wherein a subset of the plurality of micro-beads is disposed in the thermal gel and forms a barrier within the gel groove at the constriction gap to prevent the dispersion of the thermal gel onto the components.

12. The apparatus of claim 7,
wherein the second micro-device is disposed in a second cavity in a space-apart relationship with the bottom surface of the lid to form a constriction gap between the second surface of the lid and an upper surface of the second micro-device that has a minimum distance less than a minimum distance between the first surface of the lid and the upper surface of the second micro-device; and
wherein the apparatus further comprises a second thermal gel disposed between the second micro-device and the lid, wherein the second thermal gel conducts heat from the second micro-device to the lid for heat dispersion via the lid.

* * * * *

UNITED STATES PATENT AND TRADEMARK OFFICE
CERTIFICATE OF CORRECTION

| | | |
|---|---|---|
| PATENT NO. | : 11,258,229 B2 | |
| APPLICATION NO. | : 16/543341 | |
| DATED | : February 22, 2022 | |
| INVENTOR(S) | : Frederick W. Warning, Jr. | |

It is certified that error appears in the above-identified patent and that said Letters Patent is hereby corrected as shown below:

On the Title Page

Item [74], delete "Patterson + Sherdan," and insert -- Patterson + Sheridan, --.

In the Claims

In Column 10, Line 2, in Claim 1, delete "dap" and insert -- gap --.

In Column 10, Line 2, in Claim 1, delete "dap" and insert -- gap --.

In Column 11, Line 1, in Claim 7, delete "cap" and insert -- gap --.

Signed and Sealed this
Third Day of January, 2023

Katherine Kelly Vidal
*Director of the United States Patent and Trademark Office*